(12) United States Patent
Ouyang et al.

(10) Patent No.: US 7,870,893 B2
(45) Date of Patent: Jan. 18, 2011

(54) MULTICHANNEL COOLING SYSTEM WITH MAGNETOHYDRODYNAMIC PUMP

(75) Inventors: Chien Ouyang, San Jose, CA (US); Kenneth C. Gross, San Diego, CA (US)

(73) Assignee: Oracle America, Inc., Redwood City, CA (US)

( * ) Notice: Subject to any disclaimer, the term of this patent is extended or adjusted under 35 U.S.C. 154(b) by 1290 days.

(21) Appl. No.: 11/399,209

(22) Filed: Apr. 6, 2006

(65) Prior Publication Data

US 2007/0235180 A1 Oct. 11, 2007

(51) Int. Cl.
- H05K 7/20 (2006.01)
- F28D 15/00 (2006.01)
- H01L 23/34 (2006.01)
- F28F 7/00 (2006.01)

(52) U.S. Cl. ............ 165/288; 165/299; 165/80.4; 165/80.5; 165/104.31; 165/104.33; 361/698; 361/699; 361/701; 361/702; 361/703; 257/714; 417/50

(58) Field of Classification Search ........... 165/80.4, 165/80.5, 272, 104.33, 288, 299, 104.31; 361/698, 699, 701–705; 257/714; 417/50
See application file for complete search history.

(56) References Cited

U.S. PATENT DOCUMENTS

| | | | |
|---|---|---|---|
| 4,791,548 A | 12/1988 | Yoshikawa et al. | |
| 5,032,897 A | 7/1991 | Mansuria et al. | |
| 5,099,910 A | 3/1992 | Walpole et al. | |
| 5,195,102 A | 3/1993 | McLean et al. | |
| 5,220,171 A | 6/1993 | Hara et al. | |
| 5,228,502 A * | 7/1993 | Chu et al. ........... | 165/80.4 |
| 5,355,942 A | 10/1994 | Conte | |
| 5,724,818 A | 3/1998 | Iwata et al. | |
| 5,727,618 A | 3/1998 | Mundinger et al. | |
| 5,918,469 A | 7/1999 | Cardella | |
| 5,921,087 A | 7/1999 | Bhatia et al. | |
| 5,960,866 A | 10/1999 | Kimura et al. | |

(Continued)

FOREIGN PATENT DOCUMENTS

JP    1995407202094    2/1997

OTHER PUBLICATIONS

U.S. Patent and Trademark Office, "Office Action" for U.S. Appl. No. 11/601,527 mailed Jan. 14, 2008, available in PAIR.

(Continued)

*Primary Examiner*—John K Ford
(74) *Attorney, Agent, or Firm*—Meyertons, Hood, Kivlin, Kowert & Goetzel, P.C.

(57) ABSTRACT

A cooling device includes a base having cells. A pipe is coupled to the base for each of the cells. The pipes include passages that carry fluid toward the cell and away from the cell. A magnetohydrodynamic pump system coupled to the pipe circulates an electrically conductive cooling fluid within the passages and the cell. An orifice may emits jets of fluid into the cells. A controller coupled to the cooling device may independently control flow rates in two or more cells of the cooling device. The controller may receive information from the temperature sensors on the base of the cooling device for use in controlling the flow rates in the cells.

12 Claims, 7 Drawing Sheets

U.S. PATENT DOCUMENTS

| | | | |
|---|---|---|---|
| 6,094,919 | A | 8/2000 | Bhatia et al. |
| 6,233,959 | B1 | 5/2001 | Kang et al. |
| 6,233,960 | B1 | 5/2001 | Kang et al. |
| 6,250,085 | B1 | 6/2001 | Tousson |
| 6,338,251 | B1 | 1/2002 | Ghoshal et al. |
| 6,424,533 | B1 | 7/2002 | Chu et al. |
| 6,453,678 | B1 | 9/2002 | Sundhar |
| 6,463,743 | B1 | 10/2002 | Laliberte |
| 6,512,291 | B2 | 1/2003 | Dautartas et al. |
| 6,559,538 | B1 | 5/2003 | Pomerene et al. |
| 6,581,388 | B2 | 6/2003 | Novotny et al. |
| 6,645,786 | B2 | 11/2003 | Pomerene et al. |
| 6,658,861 | B1 | 12/2003 | Ghoshal et al. |
| 6,708,501 | B1 | 3/2004 | Ghoshal et al. |
| 6,711,904 | B1 | 3/2004 | Law et al. |
| 6,743,972 | B2 | 6/2004 | Macris |
| 6,903,929 | B2 | 6/2005 | Prasher et al. |
| 6,917,522 | B1 | 7/2005 | Erturk |
| 6,950,773 | B1 | 9/2005 | Gross et al. |
| 6,987,668 | B2 * | 1/2006 | Kitano et al. ............... 165/80.4 |
| 6,989,134 | B2 | 1/2006 | Tonkovich et al. |
| 7,000,684 | B2 * | 2/2006 | Kenny et al. ............... 165/80.4 |
| 7,002,801 | B2 | 2/2006 | Zeighami et al. |
| 7,020,802 | B2 | 3/2006 | Gross et al. |
| 7,058,101 | B2 | 6/2006 | Treusch et al. |
| 7,076,389 | B1 | 7/2006 | Gross et al. |
| 7,085,681 | B1 | 8/2006 | Williams et al. |
| 7,131,486 | B2 * | 11/2006 | Goodson et al. ............ 165/80.4 |
| 7,342,787 | B1 | 3/2008 | Bhatia |
| 7,436,059 | B1 | 10/2008 | Ouyang |
| 2003/0085024 | A1 | 5/2003 | Santiago et al. |
| 2003/0235504 | A1 | 12/2003 | Lemoff et al. |
| 2004/0112585 | A1 | 6/2004 | Goodson et al. |
| 2004/0182088 | A1 | 9/2004 | Ghoshal et al. |
| 2004/0234379 | A1 | 11/2004 | Miner et al. |
| 2004/0234392 | A1 | 11/2004 | Ghoshal et al. |
| 2004/0251539 | A1 | 12/2004 | Faris et al. |
| 2005/0087767 | A1 | 4/2005 | Fitzgerald et al. |
| 2005/0139345 | A1 * | 6/2005 | Pokharna et al. ........... 165/80.4 |
| 2005/0150535 | A1 | 7/2005 | Samavedam et al. |
| 2005/0150536 | A1 | 7/2005 | Ngai et al. |
| 2005/0150537 | A1 | 7/2005 | Ghoshal |
| 2005/0150539 | A1 | 7/2005 | Ghoshal et al. |
| 2005/0160752 | A1 | 7/2005 | Ghoshal et al. |
| 2005/0189089 | A1 | 9/2005 | Miner |
| 2005/0205241 | A1 | 9/2005 | Goodson et al. |
| 2005/0211417 | A1 | 9/2005 | Upadhya et al. |
| 2006/0073024 | A1 | 4/2006 | Goshal et al. |

OTHER PUBLICATIONS

U.S. Patent and Tradmark Office, "Office Action" for U.S. Appl. No. 11/523,435 mailed Aug. 29, 2008, available in PAIR.

U.S. Patent and Trademark Office, "Final Office Action" for U.S. Appl. No. 11/523,435 mailed Jan. 29, 2009, available in PAIR.

U.S. Patent and Trademark Office, "Office Action" for U.S. Appl. No. 11/523,435 mailed Apr. 16, 2009, available in PAIR.

U.S. Patent and Trademark Office, "Notice of Allowance" for U.S. Appl. No. 11/523,435 mailed Oct. 27, 2009, available in PAIR.

"TEC Integrated Heat Sinks", Enertron Custom Design & Manufacturing of Thermal Management System; Enertron, Inc., Mesa, AZ., 2002, 1 pg.

"Laser Module cooling, Design Goals and Constraints", Enertron Total Thermal Management Solutions, Enertron, Inc., Mesa, AZ, 2002, 1 pg.

Garner, Scott D., "Heat pipes for electronics cooling applications" Electronics Cooling, Thermacore, Inc., Lancaster, PA., 2001, 10pgs.

"subZero4G Thermo-Electric Cooling", Thermaltake SubZero4G Thermo-Electric Cooling, Thermaltake Technology Co., Ltd., City of Industry, CA., 2003, 6 pgs.

"The Cooligy Electrokinetic Pump", http://web.archive.org/web/20040630060103/www.cooligy.com/electrokinetic_pump.html, dated Jul. 25, 2004, 2 pgs.

"Advanced Microchannel Cooling Loop", http://web.archive.org/web/20040725041209/www.cooligy.com/microchannels.html, dated Jul. 25, 2004, 4 pgs.

"Microchannel Cooling", http://web.archive.org/web/20040619033221/www.cooligy.com/microchannels.html, dated Jul. 25, 2004, 3 pgs.

Hughes, Ronnie D. "Remote Diodes Yield Accurate Temperature Measurements", National Semiconductor, Jul. 10, 2003, Located on Manufacturing.net at http://www.manufaturing.net/article/CA307863?ticker-NSM on Feb. 1, 2004 (4 pgs.).

Co-pending U.S. Appl. No. 11/601,527, "Thermoelectric Cooling Device Arrays", to Ouyang, filed Nov. 17, 2006.

Co-pending U.S. Appl. No. 11/523,435, "Intelligent Microchannel Cooling", to Ouyang, et al., filed Sep. 19, 2006.

Snyder, G. Jeffrey, et al. "Hot Spot Cooling Using Embedded Thermoelectric Coolers", Nextreme Thermal Solutions, Research Triangle Park, NC, 22nd IEEE Semi-Therm Symposium, 2006 (9 pgs. beginning on p. 135).

Thermocore Thermal Management Solutions, Advanced Cooling Solutions for a Changing World, Electronics Cooling Group of MODINE Applied Thermal Innovation, Modine Manufacturing Company, 2005 (12 pgs).

Venkatasubramanlan, Rama, et al. "Thin-Film Thermoelectric Devices with High Room-Temperature Figures of Merit", Macmillan Magazines Ltd, Nature, vol. 413, Oct. 11, 2001, www.nature.com, Research Triangle Institute, Research Triangle Park, NC (pp. 597-602).

Moore, Bruce D. "IC Temperature Sensors Find the Hot Spots," Maxim Integrated Products, www.edmag.com, EDN Jul. 2, 1998, Sunnyvale, CA (pp. 99-110).

Maxim "± 1°C, SMBus-Compatible Remote/Local Temperature Sensors with Overtemperature Alarms", Maxim Integrated Products, Sunnyvale, CA MAX6657/MAX6658/MAX6659, www.maxim-ic.com, Rev. 4; 5/06 (pp. 1-17).

Dallas Semiconductor Maxim "MAX6657, MAX6658, MAX6659" Overview: ± 1°C, SMBus-Compatible Remote/Local Temperature Sensors with Overtemperature Alarms, Maxim Integrated Products, 2006 (2 pgs.).

* cited by examiner

MULTICHANNEL COOLING SYSTEM WITH MAGNETOHYDRODYNAMIC PUMP

BACKGROUND OF THE INVENTION

1. Field of the Invention

This invention relates generally electronic equipment, such as computers, and, more particularly, to apparatus and methods for cooling electronic devices using circulating fluids.

2. Background Information

Computer systems often require high reliability and high capacity of operation. Various approaches have been taken to providing such high-performance, high reliability systems. High density systems are typically rack mountable, with one or more processor modules occupying a prescribed space (e.g., a vertical slot) in the rack. A trend in recent times is to make the computers with smaller form factors. This means that more processors can be located in a rack. This has the advantage of increasing the processing density within the racks, and also the advantage of reducing the distance between the computer systems.

Components of computer systems may generate substantial amounts of heat during operation. Higher operating temperatures in electronic components are associated with decreased reliability of the components. To address this issue, some systems include fans or blowers to force air over the heat-generating components to cool the components.

Heat sinks may be attached to components to facilitate heat dissipation from the components. A heat sink is typically made of a thermally conductive material, such as aluminum, with a plurality of fins or pins on an exposed side of the heat sink. Heat is dissipated from the fins or pins to the surrounding air principally by thermal convection.

Some cooling systems use forced convection of fluids to carry heat from heat producing components such as microprocessors. One such system is an impinging jet cooling system. In a typical impinging jet cooling system, fluid is directed in one or more jets toward a wall of a chamber that is in contact with a heat producing component. The fluid is carried away from the chamber and through a pipe to a heat sink, where the heat can be rejected to the surroundings. The fluid from the pipes may be recirculated to the chamber, thereby enabling a continuous cooling process.

In a typical impinging jet cooling system, a constant flow of fluid may be delivered at all times, to all impinging surfaces, of the heat producing component. In reality, however, the surface of the heat producing component will have significant temporal and spatial thermal variations. A cooling solution is desired that more effectively provisions cooling fluid when and where it is most needed.

SUMMARY OF THE INVENTION

Various embodiments of systems and methods of cooling electronic devices are described. In an embodiment, a cooling device includes a base. The base includes at least one cell. A pipe is coupled to the base. The pipe includes passages that carry fluid toward the cell and away from the cell. A magnetohydrodynamic pump system coupled to the pipe circulates an electrically conductive cooling fluid within the passages and the cell. In an embodiment, a cooling device includes an orifice that emits a jet of fluid into a cell. A heat sink may be coupled to the pipes to promote rejection of heat from the pipes.

In some embodiments, the base of a cooling device includes two or more cells and a pipe coupled to each of the cells. A magnetohydrodynamic pump system may circulate fluids at different flow rates for each cell.

In one embodiment, at least one of the pipes in a cooling device includes an outer tube and an inner tube arranged concentrically. Fluid may flow to a cell from a passage in the inner tube and flow away from the cell in an annular region formed between the inner tube and the outer tube.

In an embodiment, a magnetohydrodynamic pump includes a pump having an electrically non-conductive outer tube segment and an electrically non-conductive inner tube segment in the outer tube segment. The inner tube includes an inner passage. The annular space between the inner tube and the outer tube may form an outer passage. A pair of conductors may pass through the walls of the inner tube. An insulator is coupled to each of the conductors. The insulators electrically isolate the conductors from fluid in the outer passage. Magnets may produce a magnetic field in the inner passage.

In an embodiment, a cooling system includes a controller coupled to a pump system. The controller may independently control flow rates in two or more cells of a cooling device. Temperature sensors may be located on a base of the cooling device and coupled to the controller. The controller may receive information from the temperature sensors for use in controlling the flow rates in the cells.

In an embodiment, a cooling device includes a reservoir. The reservoir may hold fluid from passages in a pipe. The reservoir may include a relief volume. Fluid may be allowed to expand into the relief volume as the total volume of the fluid in the cooling device expands during heating.

In an embodiment, a cooling system includes a cooling device and a controller. The cooling system includes a base having two or more cells and a pipe coupled to each of the cells. Each pipe includes passages to carry cooling fluid to and from one of the cells. A pump system coupled to pipes may circulate fluid independently for each of the cells. A controller coupled to the pump system may control a flow rate in each of the cells independently of one or more of the other cells. In one embodiment, the controller is a discrete time, multiple input, multiple output controller. In one embodiment, cells of the cooling device are arranged in rows and columns. Temperature sensors are coupled to the base proximate to the corners of the cells. A controller uses information from the temperature sensors to adjust a flow rate in one or more of the cells.

In an embodiment, a method of cooling a heat producing component includes coupling a cooling device having a plurality of cooling channels to the heat producing component. Each cooling channel provisions cooling fluid proximate to a region of the heat producing component. Temperature data is sensed proximate to regions of the heat producing component. A flow rate of cooling fluid is regulated for the cooling channels based on the temperature data. In some embodiments, the flow rate of cooling fluid for the cooling channels is adjusted based on changes in the temperature data over time.

BRIEF DESCRIPTION OF THE DRAWINGS

Other aspects of the invention will become apparent upon reading the following detailed description and upon reference to the accompanying drawings in which.

Figure 1:
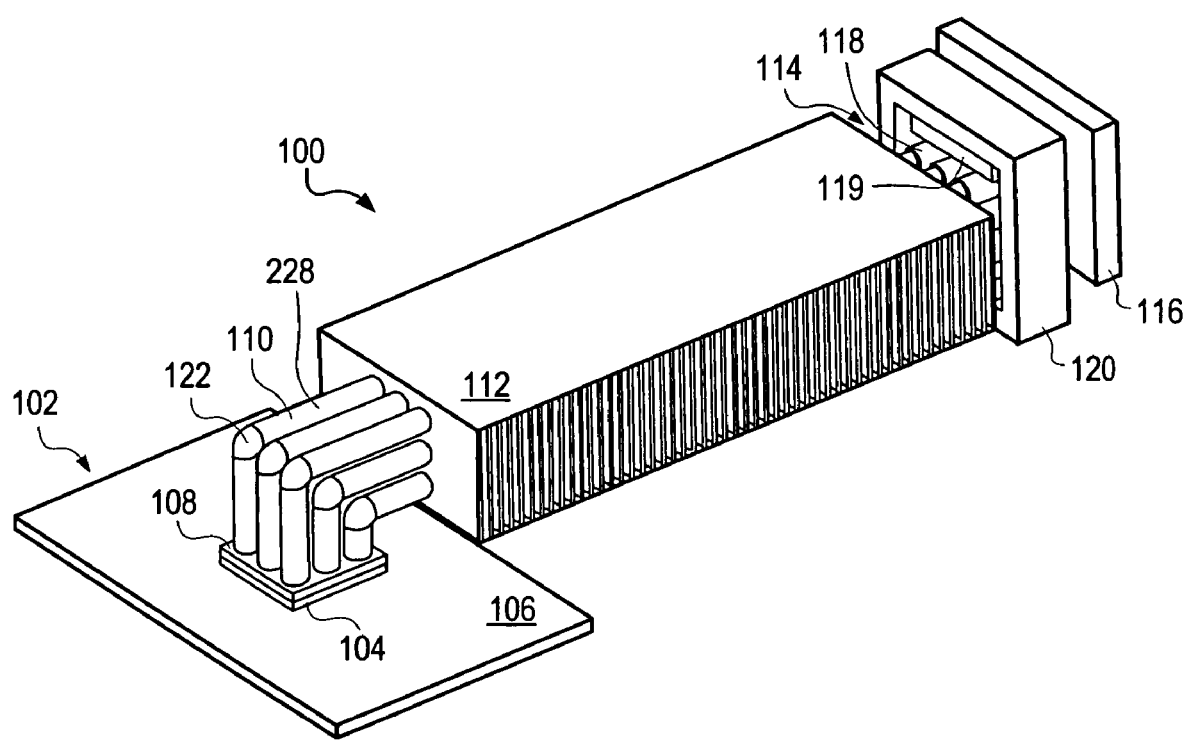
FIG. 1 depicts a cooling device coupled to a circuit module according to one embodiment.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

The following description generally relates to devices for cooling computer system components such as microprocessors. Such systems and methods may be used in a variety of applications. A non-exhaustive list of such applications includes: telecommunications network server systems; e-commerce web server systems; LAN application and file server systems; personal computer systems; and remote vehicle control systems.

As used herein, "module" includes any modular unit or subsystem. Examples of a module include, but are not limited to, a memory module, a printed circuit board assembly, an information processing cartridge, a power supply, or a combination thereof. In certain embodiments, a module may include multiple circuit boards (e.g., a mezzanine card mounted to a main circuit board). Modules may be various shapes, including, but not limited to, rectangular, triangular, or an irregular shape. In certain embodiments, components of a module may be housed in an enclosure. Sides of an enclosure for a module may include perforations or other openings to allow for a flow of cooling air through the enclosure.

As used herein, "circuit board" includes any circuit module that carries one or more other circuit modules or components. "Circuit board" includes, but is not limited to, a printed circuit board made of epoxy-glass and metal layers. As used herein, "component" includes any element of system, including, but not limited to, a printed circuit board, a semiconductor device, a resistor, or a capacitor, a power supply, or a disk drive.

As used herein, "enclosure" includes any structure that houses one or more elements of a computer system (e.g., electronic modules).

As used herein, "coupled" includes a direct coupling or an indirect coupling (e.g., with one or more intervening elements) unless expressly stated otherwise. For example, a heat sink may be coupled to a socket by directly attaching the heat sink to the socket, or by connecting the heat sink and the socket to one or more intervening elements (e.g., a bracket, a printed circuit board).

As used herein, "pipe" includes any tube or elongated member or elongated member having a hollow portion. A pipe may have one hollow passage or more than one hollow passage. Suitable cross sections for a pipe include, circular, square, rectangular, regular or irregular cross section. A cross section of a pipe may change over the length of the pipe.

FIG. 1 depicts a cooling device according to one embodiment. Cooling device 100 is coupled to circuit module 102. Circuit module 102 includes heat producing component 104. Heat producing component 104 is mounted on circuit board 106. Examples of heat producing components include microprocessors such as a central processing unit, an application specific integrated circuits (ASIC), memory chips, and disk drives. In some embodiments, a cooling device may couple to and cool multiple heat producing components, such as a row of integrated circuit packages mounted on a common circuit board.

Cooling device 100 includes base 108, pipes 110, and heat sink 112, MHD pump system 114, and reservoir 116. MHD pump system 114 includes an array of MHD pumps 118 and one or more magnets 119. As used herein, "magnetohydrodynamic pump", or "MHD pump" includes any pump that applies a voltage to a fluid in a magnetic field to produce motion in the fluid. Ferromagnetic yoke 120 is positioned around MHD pumps 118 and one or more magnets 119. Magnets 119 are coupled to ferromagnetic yoke 120.

One end of each pipe 110 is coupled to base 108. The other end of each pipe 110 is coupled to one end of one of MHD pumps 118. The other ends of MHD pumps 118 are coupled to reservoir 116. Pipes 110 may be coupled to other components of the cooling device by various methods such as soldering, brazing, or epoxy.

Pipes 110 may include passages for carrying fluid to and from base 108. Pipes 110 include right angle bend 122. Bend 122 allows a longitudinal axis of pipes 110 to be substantially parallel to a plane of circuit board 106. In other embodiments, pipes may have no bend. For example, pipes of a cooling device may extend perpendicular to a circuit board over the entire length of the pipes. In still other embodiments, pipes of a heat transfer device may include bends at various angles other than 90 degrees. In certain embodiments, pipes may extend in different directions from one another. For example, pipes in a three by three array may include bends such that the three of the pipes extend in one direction, while the other six pipes of the array include bends to extend in direction opposite the three pipes. Distributing different pipes or groups of pipes in different directions may promote rejection of heat from the pipes (e.g., by exposing more surface area of the pipes to the surroundings).

Figure 2A:
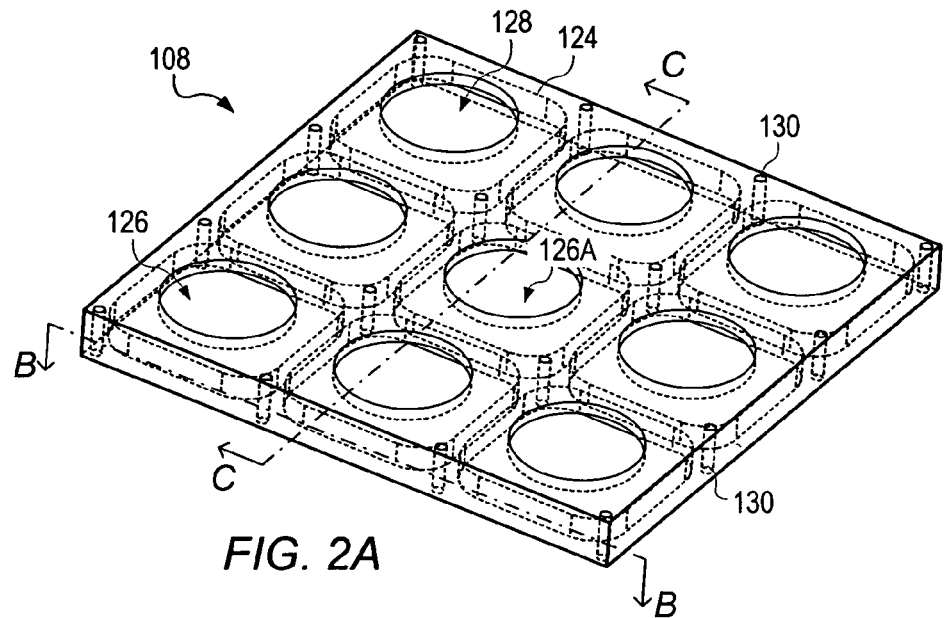
FIG. 2A depicts a base of a cooling device according to one embodiment.

FIG. 2A depicts base 108 of cooling device 100. Base 108 includes body 124. Body 124 has an array of internal cells 126. As used herein, "cell" includes any chamber or hollow passage. Cells 126 may have various shapes and sizes, including round, square, rectangular, ovate, or irregular. Each of cells 126 may provide a separate region for fluid cooling of a heat producing component coupled to the base. Cells 126 include openings 128. One of pipes 110 shown in FIG. 1 maybe coupled to base 108 at each of openings 128. Each of pipes 110 may introduce and remove fluid from one of cells 126. Base 108 may include sockets 130. Sockets 130 may receive temperature sensors or other devices for monitoring conditions in cells 126.

Figure 2B:
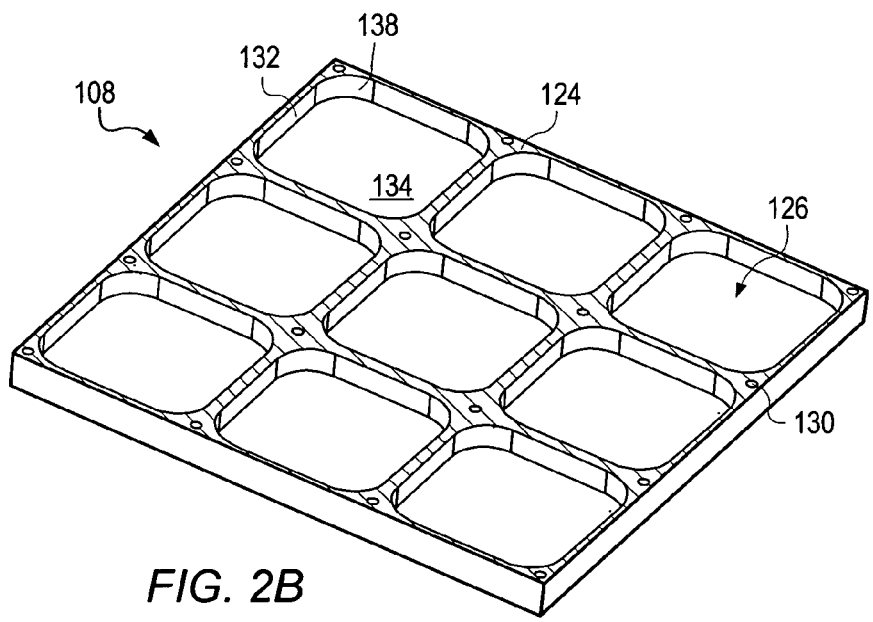
FIG. 2B depicts a cross sectional view of the base depicted in FIG. 2A, taken substantially along lines B-B.
Figure 2C:
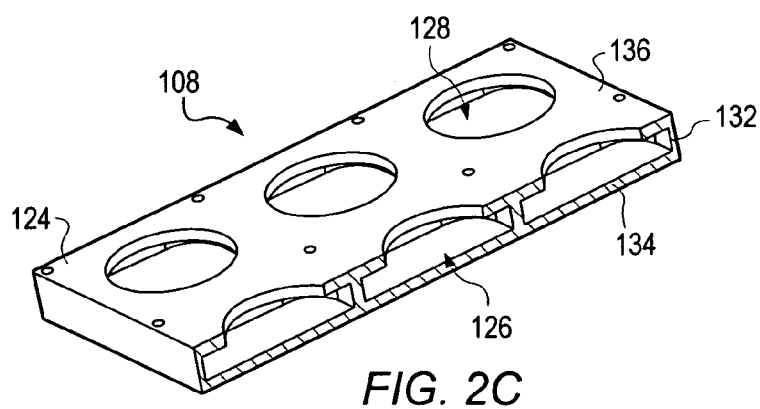
FIG. 2C depicts a cross sectional view of the base depicted in FIG. 2A, taken substantially along lines C-C.

FIGS. 2B and 2C depict cross sectional views of base 108 shown in FIG. 2A. Cells 126 include side walls 132, bottom walls 134, and top walls 136. Cells 126 include round corners 138 where adjacent side walls 132 meet.

Figure 3:
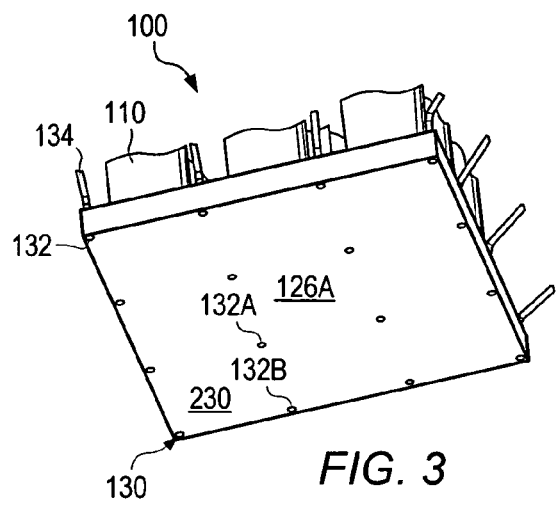
FIG. 3 depicts a base including temperature sensors according to one embodiment.

FIG. 3 depicts a cooling device including temperature sensors according to one embodiment. Cooling device 100 includes pipes 110 coupled to base 108. Cooling device 100 includes temperature sensors 132 in sockets 130 of base 108. Suitable temperature sensors may include thermocouples, thermistors, resistance temperature devices (RTDs), infrared radiation sensors, bimetallic devices, and change-of-state sensors.

One of sensors 132 is located in each corner of cells 126 (shown in FIG. 2A). Some of temperature sensors adjoin multiple cells 126. For example, temperature sensor 132A is at the corners of four of cells 126 and temperature sensors 132B is at the corners of two of cells 126. Temperature sensors 132 that adjoin multiple cells 126 may be used to provide thermal data for use in monitoring cooling in all the adjoining cells. Temperature sensors 132 are coupled to leads 134. Leads 134 may connect temperature sensors 132 to systems for monitoring performance and controlling fluid systems in cooling device 100. In certain embodiments, non-temperature sensors such as flow rate sensors or pressure sensors may be included in a cooling device.

Figure 4:
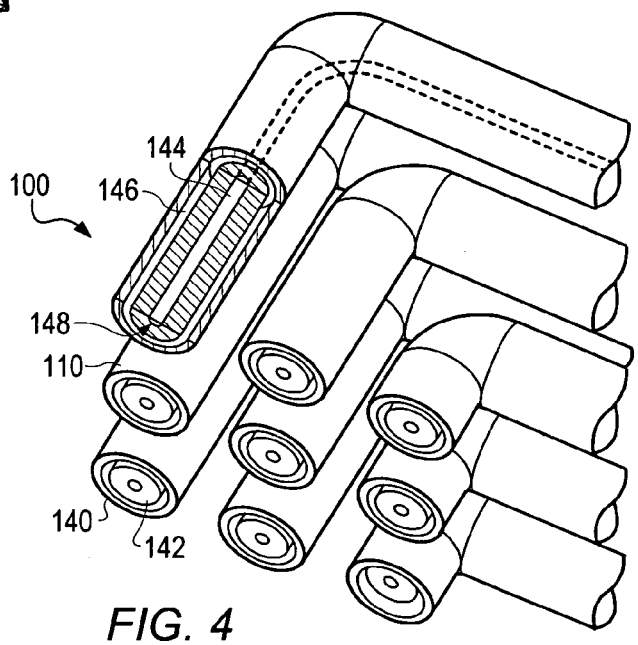
FIG. 4 depicts one end of an array of pipes of a cooling device according to one embodiment.

FIG. 4 depicts an end view of pipes 110 when removed from base 108 according to one embodiment. Each pipe 110 includes outer tube 140 and inner tube 142. Inner tube 142 includes core passage 144. Pipe 110 includes annular passage 146 between an outer surface of inner tube 142 and an inner surface of outer tube 140. Passage 144 may terminate at opening 148.

In some embodiments, fluid may be introduced into a cell as a jet. As used herein, a "jet" includes any stream of fluid from an orifice, nozzle, or opening. A heat transfer device may include an orifice for introducing fluid into a cell. As used herein, an "orifice" includes any opening in an element of a fluid system. An orifice may have any of various shapes, including round, square, oval, or irregular. In some embodiments, an orifice may be an opening at the end of a hollow tube. For example, in the embodiment shown in FIG. 4, openings 148 at the end of core passages 144 may serve as orifices for introduction of fluid into their associated cells 126. In other embodiments, a separate component, such as a nozzle or orifice plate, may be coupled to the end of a tube or pipe, with the orifice being provided as an aperture in the separate component.

Figure 5:
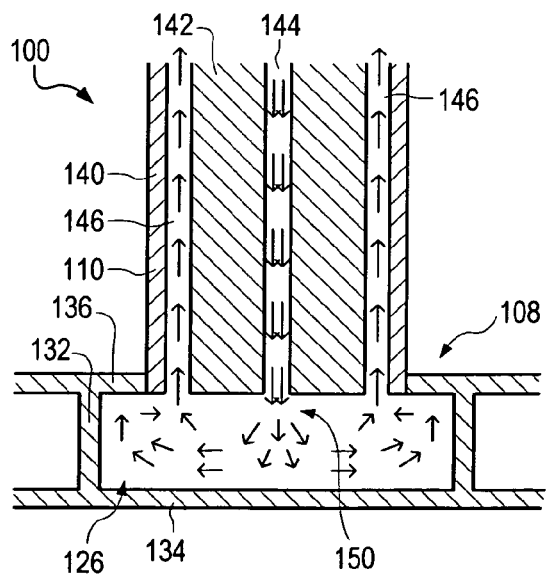
FIG. 5 depicts a flow diagram of a cell of a cooling device according to one embodiment.

FIG. 5 depicts introduction of fluid into cell 126 of cooling device 100 according to one embodiment. Fluid may flow toward cell 126 in core passage 144. Fluid may pass through opening 148 to create jet 150. Jet 150 may impinge on bottom wall 134, side walls 132, and top wall 136 of cell 126. Jets 150 may provide turbulent flow in cell 126. Turbulence near the walls of cell 126 may promote rejection of heat from base 108 into the fluid, thereby enhancing cooling effectiveness of cooling device 100. Fluid may be forced from cell 126 into annular passage 146.

Figure 6:
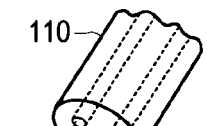
FIG. 6 depicts a pipe including non-concentric passages according to one embodiment.

FIG. 6 depicts an alternate embodiment of a pipe for carrying fluid to and from a heat producing component. Pipe 110 includes passages 154. One of passages 154 may be used to carry fluid to a cell of a heat transfer device, and the other passage may be used to carry fluid away from the cell. In certain embodiments, two or more passages carry fluid to a cell, and two or more passages carry fluid away from the cell.

Figure 7:
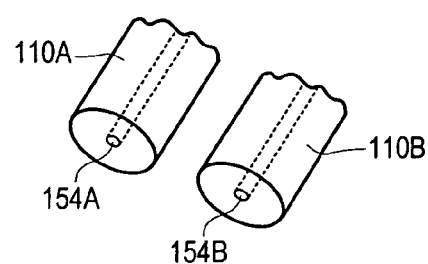
FIG. 7 depicts a pair of pipes for a cooling device according to one embodiment.

In some embodiments, different pipes carry fluid to and from a cell of a cooling device according to one embodiment. FIG. 7 depicts a multiple pipe arrangement for carrying fluid to and from a cell. Pipe 110A includes passage 154A. Pipe 110B includes passage 154B. Fluid passage 154A may be used to carry fluid to a cell. Passage 154B may be used to carry fluid away from a cell. In certain embodiments, pipes 110A and pipes 110B may diverge from one another.

Figure 8:
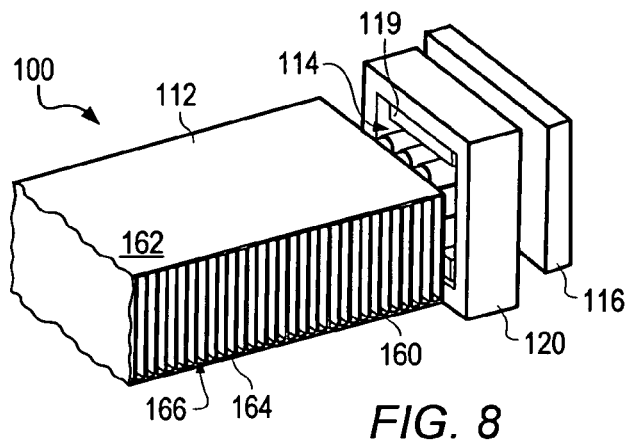
FIG. 8 depicts a rear portion of a cooling device according to one embodiment.

FIG. 8 depicts the rear portion of cooling device 100 including MHD pump system 114 according to one embodiment. Magnets 119 may be positioned above and below MHD pumps 118. Heat sink 112 includes fins 160, upper plate 162, and lower plate 164. Air channels 166 may be formed between fins 160. In certain embodiments, air or another fluid may be forced through channels to promote cooling of the pipes. In certain embodiments, pipes may be coupled to other elements to promote cooling of the pipes, such as folded fins, radial fins, or pins. Pipes 110, heat sink 112, and other heat dissipating elements may be made of thermally conductive materials, such as copper or aluminum.

Figure 9:
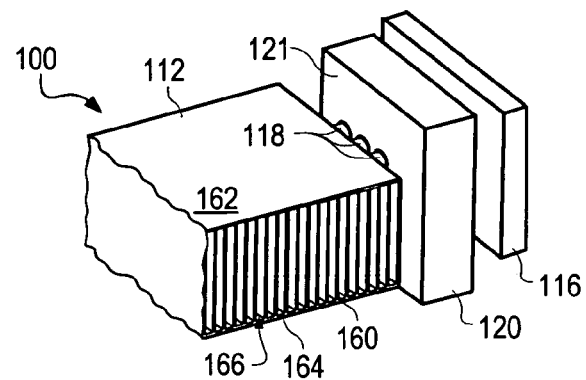
FIG. 9 depicts a rear portion of a cooling device including a pump cover.

In some embodiments, elements of a cooling device may provide shielding of components in an MHD pump system. FIG. 9 depicts cover 121 over MHD pump system 114. Ferromagnetic yoke 120 and cover 121 may be made of any suitable ferromagnetic material, such as a nickel-iron-cobalt material. Cover 121 may reduce the effects of fields in the MHD pump system on electronic components of the system.

Figure 10:
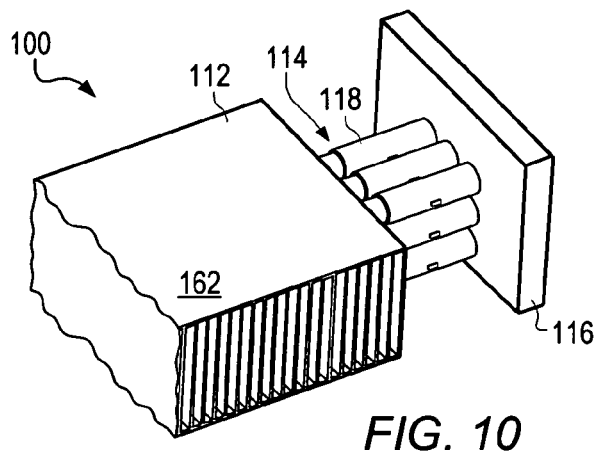
FIG. 10 depicts a rear portion of a cooling device the rear portion of the cooling device shown in FIG. 8 with the magnetic yoke removed.

FIG. 10 depicts rear portion of cooling device 100 with ferromagnetic yoke 120 removed for clarity. MHD pumps 118 are coupled to each of pipes 110. MHD pumps 118 extend from the rear of heat sink 112. The rearmost ends of MHD pumps 118 couple with reservoir 116.

Figure 11:
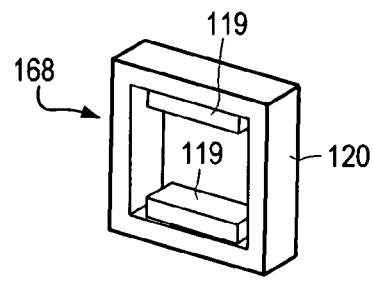
FIG. 11 depicts a magnetic yoke assembly according to one embodiment.

FIG. 11 depicts magnetic yoke assembly 168. Magnets 119 are attached on top and bottom interior surfaces of ferromagnetic yoke 120. In some embodiments, magnets 119 are permanent magnets. In other embodiments, magnets 119 may be electromagnets. As shown in FIGS. 8 and 9, two magnets 119 are provided for all the MHD pumps 118 in the system. In other embodiments, however, a system may include separate magnets for each MHD pump in the system.

Figure 12:
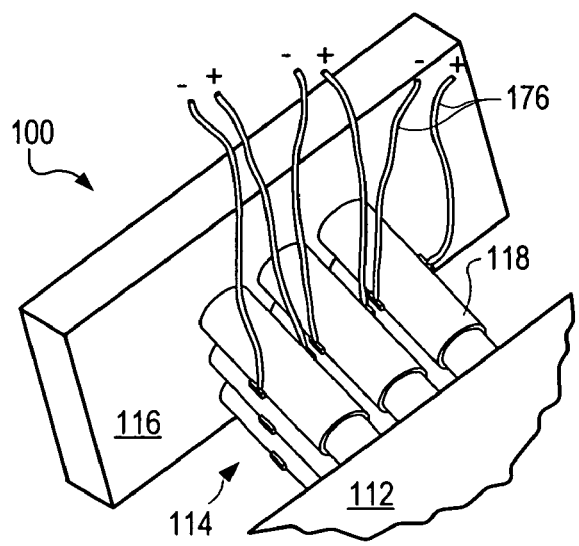
FIG. 12 depicts a cutaway view of a reservoir of a cooling device according to one embodiment.
Figure 13:
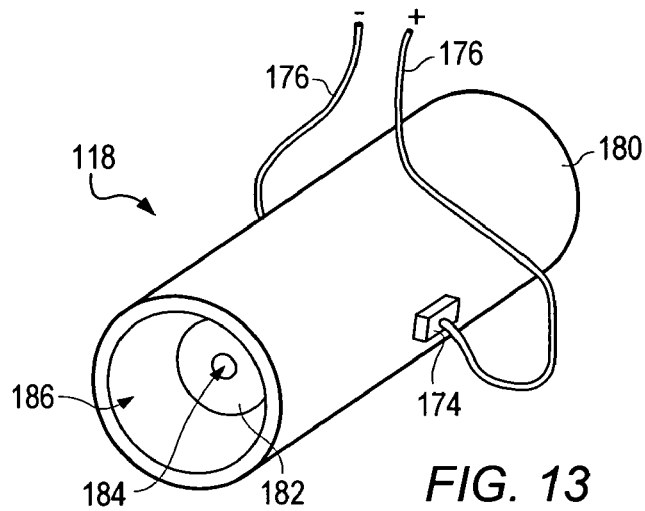
FIG. 13 depicts an array of magnetohydrodynamic pumps according to one embodiment.

FIG. 12. is a view of a rear portion of cooling device 100 including MHD pump system 118. Ferromagnetic yoke 120 has been removed from the view for clarity. FIG. 13 depicts a single MHD pump 118 of MHD pump system 114. MHD pumps 118 of MHD pump system 112 may each include a pair of electrodes 174 on opposing sides of the MHD pump. Electrodes 174 are coupled to leads 176. Leads 176 may be coupled to a controller. MHD pump 118 includes outer tube segment 180 and inner tube segment 182. Outer tube segment 180 and inner tube segment 182 may be made of electrically non-conductive materials. Suitable materials may include ceramics and polymers. Outer tube segment 180 and inner tube segment 182 may be arranged concentrically.

Inner tube segment 182 includes pump core passage 184. Pump core passage 184 may extend the length of inner tube segment 182. Pump annular passage 186 may be formed between the inner surface of outer tube segment 180 and the outer surface of inner tube segment 182. Outer tube segment 180 and inner tube segment 182 may couple with one of pipes 110 such that core passage 144 of pipe 110 communicates with pump core passage 184 of MHD pump 118, and annular passage 146 of pipe 110 communicates with pump annular passage 186 of MHD pump 118.

Figure 14:
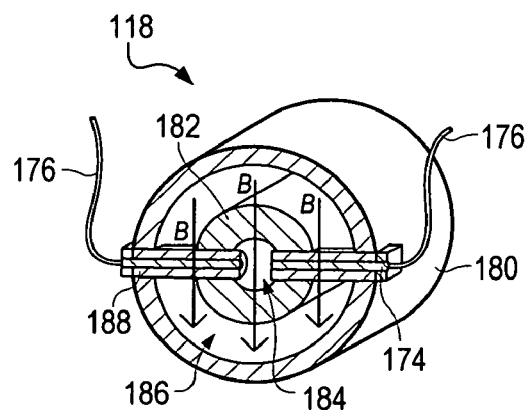
FIG. 14 depicts a magnetohydrodynamic pump according to one embodiment.
Figure 15:
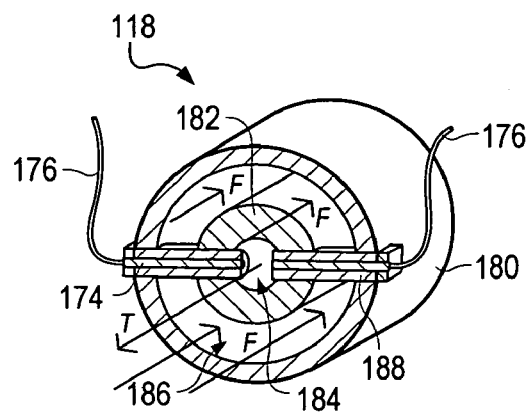
FIGS. 15 and 16 are cross sectional views of the magnetohydrodynamic pump shown in FIG. 14.

FIGS. 14 and 15 depicts a cross sectional view of MHD pump 118 according to one embodiment. Electrodes 176 pass through outer tube segment 180 and inner tube segment 182 on either side of the tube segments. Insulators 188 cover electrodes 174 between the inner surface of outer tube segment 180 and the outer surface of inner tube segment 182, thereby electrically isolating electrodes 184 from any fluids in pump annular passage 186. The ends of electrodes 174 are exposed in pump core passage 184. In some embodiments, electrodes 174 and/or insulator 188 may maintain outer tube segment 180 and inner tube segment 182 in a fixed relationship with each other. In other embodiments, outer tube segment 180 and inner tube segment 182 may be maintained in a fixed relationship with radial spacers placed between the inner surface of outer tube segment 180 and the outer surface of inner tube segment 182.

Pump 118 may pump an electrically conductive, thermally conductive liquid through pump core passage 184. Suitable liquids for a cooling system may include gallium-based low melting point alloys such as Indalloy® alloys, made by Indium Corporation of America. To operate pump 118, voltage maybe applied across the pair of electrodes 184. Electrical current may flow from left to right in pump core passage 184. Permanent magnet may create magnetic field B in the location of pump core passage 184. Based on the Lorentz force law, a force is applied to the cooling liquid in pump core passage 184. The force may cause fluid to flow in pump core passage 184 in the direction of arrow T. Fluid may return through pump 118 via pump annular passage 186 as indicated by arrows F in FIG. 15. The flow rate is a function of the voltage applied across electrodes 174.

Figure 16:
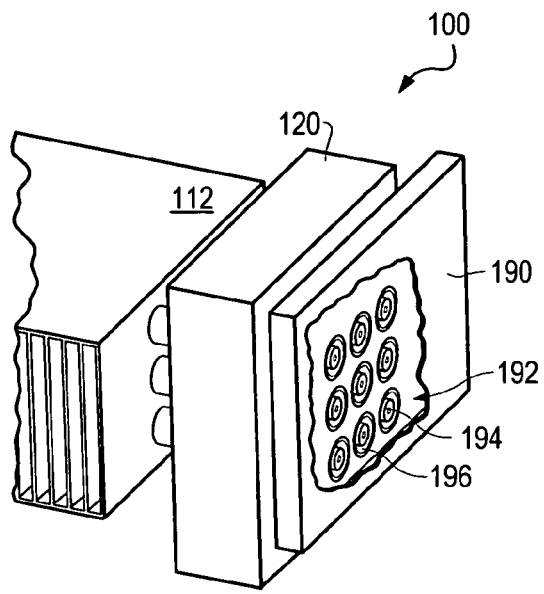

FIG. 16 is a view of a rear portion of cooling device 100 with a partial cut away view of reservoir 116. As used herein, "reservoir" includes any element that holds a volume of fluid. Reservoir 116 may include container 190 defining chamber 192. MHD pumps 118 couple with reservoir 116. Passages 194 and 196 open into chamber 192. During operation of the cooling device, fluid may flow from passages 196 into chamber 192 of reservoir 116. Simultaneously, fluid may be drawn from chamber 192 into passages 194 and carried toward base 108. In certain embodiments, reservoir 116 may include fins, pins, or other elements to promote rejection from the fluid in the reservoir into the environment.

Figure 17:
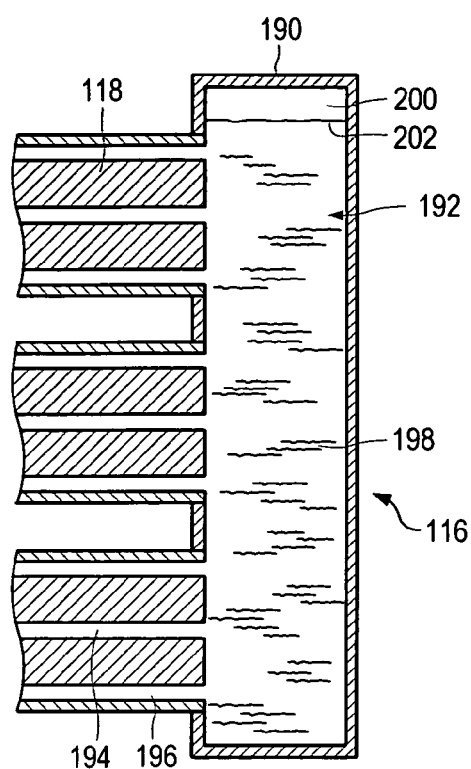
FIG. 17 is a cross sectional view of a reservoir according to one embodiment.

FIG. 17 is a cross sectional side view of reservoir 116. Container 190 may hold cooling liquid 198 in chamber 192. Cooling liquid 198 may not fill the entire chamber 192, leaving relief volume 200 at the top of chamber 192. Relief volume 200 may maintained at low pressure. In one embodiment, relief volume 200 may be a vacuum. In another embodiment, relief volume may include a gas (e.g., an inert gas) under low pressure. During operation, cooling liquid 198 may expand as the cooling liquid receives heat from heat producing component 104. Level 202 of cooling liquid 198 in chamber 192 may rise as the total volume of cooling liquid 198 increases. Relief volume 200 may reduce stresses on heat sink components that might otherwise be placed on the components as cooling liquid 198 expands during heating or shrinks during cooling, thereby increasing thermal-mechanical reliability of cooling device 100.

Figure 18:
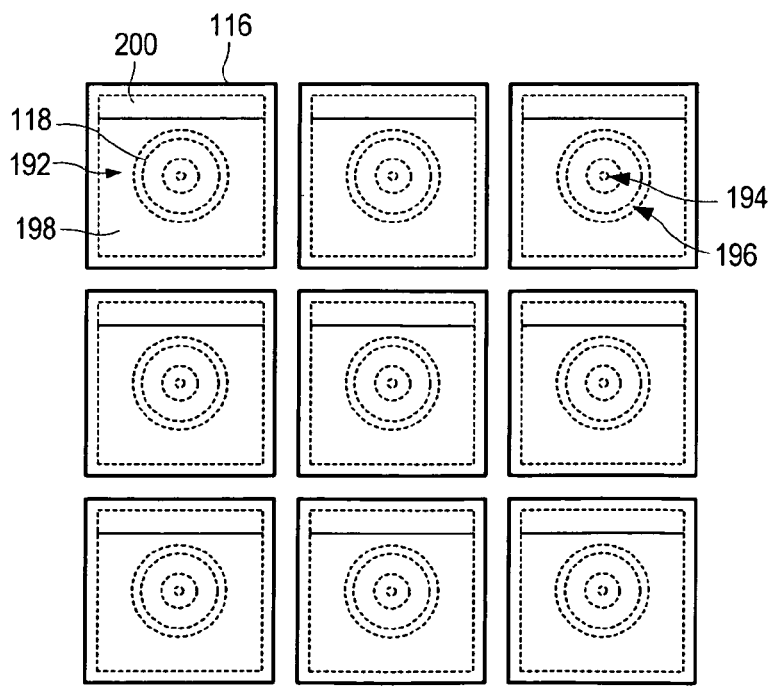
FIG. 18 depicts a cooling device including multiple reservoirs according to one embodiment.

In the embodiment shown in FIGS. 16 and 17, cooling liquids from all the cooling channels pass through a common reservoir. A common reservoir may allow cross cooling between channels. For example, liquid entering from one of the hotter channels of a cooling device may be mixed with liquid from one of the cooler channels, thereby decreasing the temperature of the liquid from the hotter channel. Nevertheless, in certain embodiments, two or more separate reservoirs may be provided for channels of a cooling system. FIG. 18 depicts an end view of an embodiment of a cooling device including multiple reservoirs. In this embodiment, each pump 118 is coupled to a separate reservoir 116. Each reservoir 116 includes chamber 192 and relief volume 200. A cooling system having separate reservoirs for separate cooling channels may increase isolation between channels.

Heat producing components (e.g., heat producing component 104) may produce different amounts of heat in different regions of the component. For example, semiconductor devices within a microprocessor package may be concentrated in one region of the package. In addition, some regions of a component may heat faster than others because of their location in the structure of the component. For example, a given amount of power, the center of component 104 may heat faster than the edge of component 104 because the center is farther from any radiating surfaces (e.g., the sides) of the component. Moreover, the operating temperature of a region of a component may be affected by temporal factors. For example, semiconductor devices in one portion of a component may operate continuously, while semiconductor devices in another portion of the component may operate only intermittently.

In some embodiments, a multi channel cooling system may provide different cooling capacity for different regions of a component or group of components. The cooling capacity within a channel of a cooling system may be changed over time. In some embodiments, a cooling system uses feedback from temperature sensors on a cooling device to regulate cooling. In one embodiment, a controller provisions a cooling liquid to one or more regions of a component in proportion to thermal flux of the regions.

Figure 19:
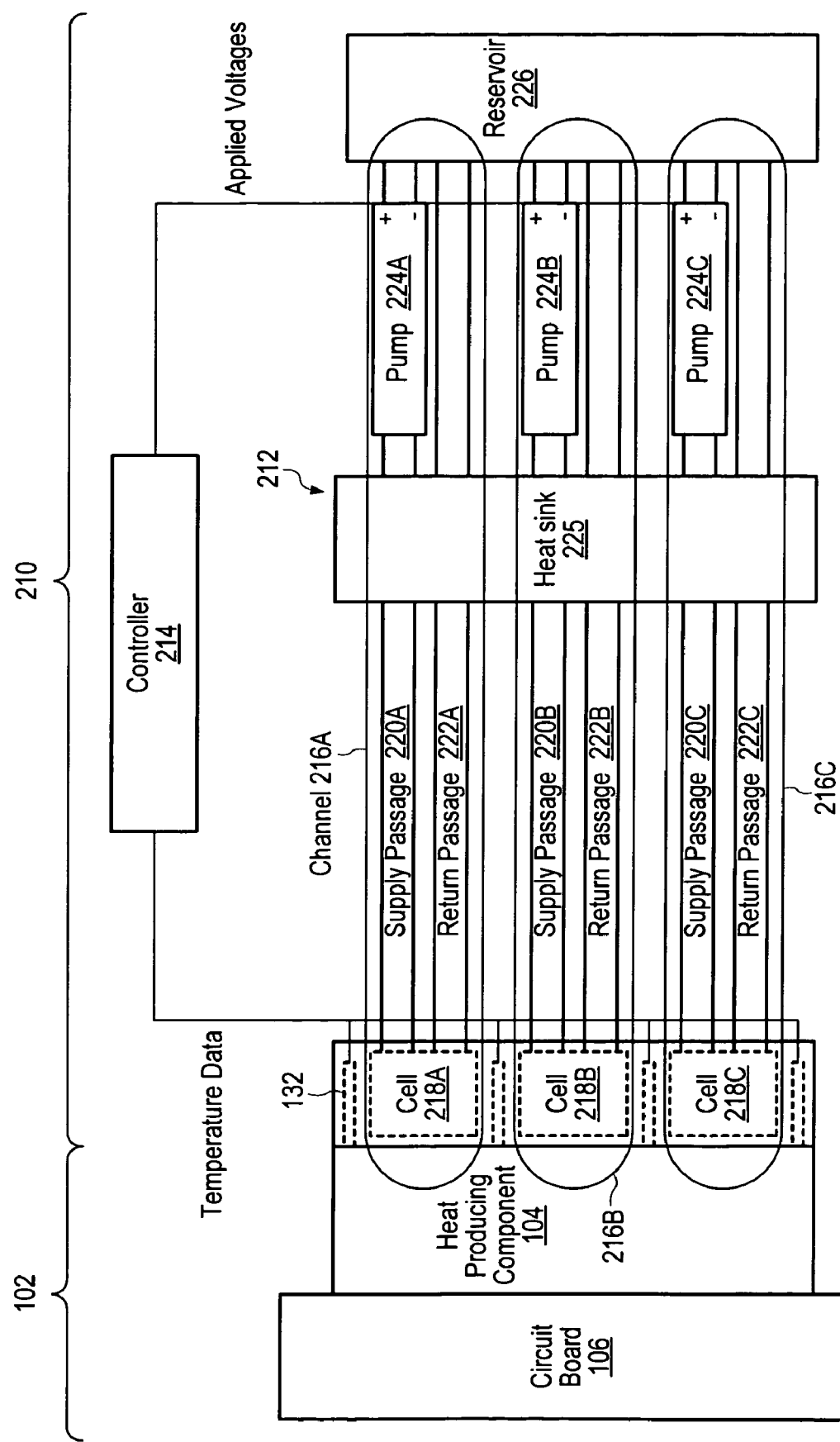
FIG. 19 is a block diagram of a cooling system including a multi-channel cooling device and a controller according to one embodiment.

FIG. 19 depicts a block diagram of a cooling system with feedback according to one embodiment. Cooling system 210 includes cooling device 212, controller 214, and temperatures sensors 132. In one embodiment, cooling device 212 may be as shown in FIG. 1. Cooling device 212 includes two or more cooling channels 216. Each cooling channel 216 includes cell 218, supply passage 220, return passage 222, and pump 224. Each of the passages may pass through heat sink 225. Pumps 224 couple with reservoir 226. Controller 214 is coupled to temperature sensors 132 and pump 224. In a preferred embodiment, the controller is a discrete time, multiple input, multiple output (MIMO) controller. Controller 214 may be operated according to a feedback and control algorithm that optimizes fluid flow rates in the channels.

As shown in FIG. 3, temperatures sensors 132 may be located in a base of the cooling device. Temperature sensors 132 may in certain embodiments be placed in other locations, such as on or near heat producing component 104, or on or near circuit board 106.

During operation of cooling system 210, controller 214 may receive temperature data from temperature sensors 132. Temperature sensors 132 may measure thermal conditions on or near heat producing component 104. Controller 214 regulates a flow rate of each of pumps 224 separately by controlling the voltage across the electrodes of each pump 224. In some embodiments, controller 214 applies a different voltage to each pump 224 such that each cooling channel 216 operates at a different flow rate. For example, if channel 216A cools a hotter region of component 104 than channel 216B, pump 224A may be operated at a higher flow rate than pump 224B. In some embodiments, controller 214 controls the flow rates in channels 216 dynamically during operation of cooling system 210. Controller 214 may use information from temperature sensors 132 to determine the appropriate operating parameters for each channel 216. For example, as temperature sensors for channel 216A indicate an increase in temperature near cell 218A, the operating voltage for pump 224A may be increased, thereby increasing the flow rate in channel 216A. In some embodiments, controller 214 is used to reduce thermal gradients in heat producing component 104. Reducing thermal gradients in an electronic component such as a microprocessor may improve long-term reliability of the component.

For each channel 216, controller 214 may use data from more than one temperature sensor 132. For example, referring again to FIG. 3, controller 214 may use temperature data from temperature sensors 132 to control the flow rate in a cell that is associated with region 230 on base 108. Using temperature data from multiple data sensors for a cell may provide more accurate measurement of conditions over the surface of a heat producing component, thereby increasing cooling effectiveness of the cooling system. In one embodiment, a controller may use data from temperature sensors in a particular cell and in one or more of the nearest neighboring cells.

In some embodiments, different channels may have different construction and/or operating characteristics. Examples of such characteristics include the size of the supply and/or return passages, the size of a pump for a channel, the length of a pipe, and the location of the pipe relative to external cooling air. In certain embodiments, pipes for different passages may be arranged to increase the cooling effectiveness of a particular channel. For example, if center cell associated with area 126A shown in FIG. 3 corresponds to the hottest region of heat producing component 104, the routing of the pipes might be arranged such that the pipe coupled to the center cell passes through heat sink 112 in the position of corner pipe section 228 shown in FIG. 1. Since corner pipe section 228 is on the periphery of the array of pipes 110 (i.e., in the upper corner rather than in the center position), corner pipe section 228 may reject more heat to the surroundings through natural convection or forced air convection through heat sink 112 than other pipes in the array. Arranging pipes of a multichannel cooling device to promote heat rejection for the hotter channels of a cooling device may help reduce thermal gradients in a heat producing component, thereby increasing reliability of the system.

Although the embodiments described herein use an MHD pump, a cooling device may in some embodiments use other pump types. Examples of suitable pumps may include peristaltic pumps, rotary pumps, and membrane pumps. In addition, a pump may in some embodiments be placed in a different position in a cooling system. For example, in the example shown in FIG. 1, pumps 118 might be located between heat sink 112 and base 108.

Although the embodiment of a cooling device described herein includes a three by three arrangement of cells, each coupled to a separate pipe, a heat transfer device may in other embodiments include other arrangements. A heat transfer device may provide any number and arrangement of cells. For example, in another embodiment, a heat transfer device may include two or more cells in an inline arrangement. In addition, a pipe may provide in certain embodiments supply and remove cooling liquid from more than one cell. Similarly, a single pump may pump cooling liquid for more than one cell.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims. For example, when the terms "front," "rear," "vertical," "horizontal" "upward", "downward," "under", "over," "left," or "right" are used in the claims, they are to be understood to relate to the Figures as illustrated. However, the device may be turned at an angle to the horizontal or inverted with the quoted terms referring to the altered orientation. As used herein, the word "may" is used in a permissive sense (i.e., meaning having the potential to), rather than the mandatory sense (i.e., meaning must). Similarly, the words "include", "including", and "includes" mean including, but not limited to.

What is claimed is:

1. A cooling device, comprising:
   a base configured to couple with an electronic device, the base comprising at least one cell;
   at least one pipe coupled to the base, the at least one pipe comprising a first passage in fluid communication with the at least one cell and a second passage in fluid communication with the at least one cell, the first passage being configured to carry fluid toward the at least one cell and the second passage being configured to carry fluid away from the at least one cell;
   a magnetohydrodynamic pump system coupled to the at least one pipe configured to circulate fluid within the passages and the at least one cell, wherein the magnetohydrodynamic pump system comprises at least one pump comprising:
      an electrically non-conductive outer tube segment;
      an electrically non-conductive inner tube segment at least partially disposed in the outer tube, the inner tube comprising an inner passage, at least a portion of the space between the inner tube and the outer tube forming an outer passage;
      a plurality of conductors, each conductor passing through a wall of the outer tube and a wall of the inner tube;
      an insulator coupled to each of the plurality of conductors, each insulator configured to electrically insulate the respective conductor from fluid in the outer passage; and
      one or more magnets configured to produce a magnetic field in the inner passage; and
   an orifice configured to emit a jet of fluid from the first passage into the at least one cell when the fluid is circulated by the magnetohydrodynamic pump system.

2. The cooling device of claim 1, wherein the base comprises a plurality of cells and at least one pipe coupled to each of the cells, the at least one pipe comprising a passage configured to carry fluid toward the cell and a passage configured to carry fluid away from the cell.

3. The cooling device of claim 2, wherein the magnetohydrodynamic pump system is configured to circulate fluid in at least one of the cells at a different flow rate from at least one of the other cells.

4. The cooling device of claim 1, further comprising a controller coupled to the magnetohydrodynamic pump system, the controller configured to control a fluid flow rate of at least one of the cells independently of one or more of the other cells.

5. The cooling device of claim 1, further comprising:
   a reservoir in fluid communication with the first passage and the second passage; and
   fluid configured to flow in a circuit through the first passage, the cell, the second passage, and the reservoir, wherein the reservoir comprises a relief volume,
      wherein the fluid is allowed to expand into the relief volume as the volume of the fluid expands during heating.

6. The cooling device of claim 1, wherein the base comprises a plurality of cells and at least one pipe coupled to each of the cells, the at least one pipe comprising a first passage configured to carry fluid toward the cell and a second passage configured to carry fluid away from the cell, the cooling device further comprising:
   a reservoir in fluid communication with the first passage and the second passages; and
   fluid configured to flow in a circuit through each of the respective cells, respective first and second passages, and the reservoir, wherein the reservoir comprises a relief volume, wherein the fluid is allowed to expand into the relief volume as the volume of the fluid expands during heating.

7. The cooling device of claim 1, wherein the at least one pipe comprises a first pipe comprising an outer tube and an inner tube, wherein the first passage comprises a passage through the inner tube, wherein the second passage comprises an annular region formed between the inner tube and the outer tube.

8. A cooling system, comprising:
   a cooling device, comprising:
      a base configured to couple with an electronic device, the base comprising at least one cell;
      at least one pipe coupled to the base, the at least one pipe comprising a first passage in fluid communication with the at least one cell and a second passage in fluid communication with the at least one cell, the first passage being configured to carry fluid toward the at least one cell and the second passage being configured to carry fluid away from the at least one cell; and
      a magnetohydrodynamic pump system coupled to the at least one pipe configured to circulate fluid within the passages and the at least one cell, wherein the magnetohydrodynamic pump system comprises at least one pump comprising:
         an electrically non-conductive outer tube segment;
         an electrically non-conductive inner tube segment at least partially disposed in the outer tube, the inner tube comprising an inner passage, at least a portion of the space between the inner tube and the outer tube forming an outer passage;
         a plurality of conductors, each conductor passing through a wall of the outer tube and a wall of the inner tube;
         an insulator coupled to each of the plurality of conductors, each insulator configured to electrically insulate the respective conductor from fluid in the outer passage; and
         one or more magnets configured to produce a magnetic field in the inner passage; and
      a controller coupled to the magnetohydrodynamic pump system, wherein the controller is configured to control a flow rate in the at least one cell.

9. The cooling system of claim 8, wherein the base comprises a plurality of cells, wherein the controller is configured to control a fluid flow rate of at least one of the cells independently of one or more of the other cells.

10. The cooling system of claim 8, wherein the base comprises a plurality of cells and at least one pipe coupled to each of the cells, the at least one pipe comprising a passage configured to carry fluid toward the cell and a passage configured to carry fluid away from the cell.

11. The cooling system of claim 8, wherein the base comprises a plurality of cells, wherein the magnetohydrodynamic pump system comprises two or more magnetohydrodynamic pumps, wherein at least a first one of the magnetohydrodynamic pumps is configured to circulate fluid in at least a first one of the cells, and wherein at least a second one of the magnetohydrodynamic pumps is configured to circulate fluid in at least a second one of the cells.

12. The cooling system of claim 8, wherein the base comprises a plurality of cells, wherein the magnetohydrodynamic pump system is configured to circulate fluid in at least one of the cells at a different flow rate from at least one of the other cells.

* * * * *